(12) United States Patent
Mayer et al.

(10) Patent No.: US 7,786,757 B2
(45) Date of Patent: Aug. 31, 2010

(54) INTEGRATED CIRCUITS WITH HYBRID PLANER HIERARCHICAL ARCHITECTURE AND METHODS FOR INTERCONNECTING THEIR RESOURCES

(75) Inventors: Ernst Mayer, Cupertino, CA (US); Ronald H. Nicholson, Jr., Santa Clara, CA (US); Steven Winegarden, Sunnyvale, CA (US)

(73) Assignee: Agate Logic, Inc., Cupertino, CA (US)

( * ) Notice: Subject to any disclaimer, the term of this patent is extended or adjusted under 35 U.S.C. 154(b) by 25 days.

(21) Appl. No.: 12/053,546

(22) Filed: Mar. 21, 2008
(Under 37 CFR 1.47)

(65) Prior Publication Data
US 2009/0237111 A1 Sep. 24, 2009

(51) Int. Cl.
*H03K 17/16* (2006.01)
(52) U.S. Cl. .............................. 326/38; 716/3; 716/16; 716/17
(58) Field of Classification Search .................. 326/38; 716/3, 17, 16
See application file for complete search history.

(56) References Cited

U.S. PATENT DOCUMENTS

| 6,940,308 | B2 | 9/2005 | Wong | |
|---|---|---|---|---|
| 6,988,258 | B2* | 1/2006 | Tan et al. | 716/17 |
| 7,000,212 | B2* | 2/2006 | Agrawal et al. | 716/17 |
| 7,165,230 | B2* | 1/2007 | Park | 716/3 |
| 7,290,237 | B2* | 10/2007 | Perry et al. | 716/17 |
| 2003/0039262 | A1 | 2/2003 | Wong et al. | |
| 2004/0010767 | A1* | 1/2004 | Agrawal et al. | 716/16 |
| 2006/0268909 | A1* | 11/2006 | Langevin et al. | 370/405 |
| 2008/0005716 | A1* | 1/2008 | Perry et al. | 716/17 |

OTHER PUBLICATIONS

Raphael Rubin and André DeHon, "Design on FPGA Interconnect for Multilevel Metalization," Proceedings of the International Symposium on Field-Programmable Gate Arrays (FPGA2003, Feb. 23-25, 2003), pp. 154-163.
Stephen Trimberger (editor), "Field-Programmable Gate Array Technology," Kluwer, 1994.
Stephen D. Brown, Robert J. Francis, Jonathan Rose, Zvonko G. Vranesic, "Field-Programmable Gate Arrays," Kluwer Academic Publishers, 1992, pp. 4-5.
J. Rose and S. Brown, "Flexibility of Interconnection Structures for Field Programmable Gate Arrays," IEEE Journal on Solid-State Circuits, vol. 26, No. 3, Mar. 1991.

* cited by examiner

*Primary Examiner*—Jean B Jeanglaude
(74) *Attorney, Agent, or Firm*—Venture Pacific Law, PC

(57) ABSTRACT

Methods for interconnecting base, switching and interconnect resources for configurable integrated circuits are provided, where these methods include the following steps: interconnecting base and switching resources with interconnect resources to form a hierarchical interconnect structure; physically placing the hierarchical interconnect structure in a two dimensional format; and directly interconnecting selected neighboring base and switching resources. The integrated circuits generated include base resources, interconnect resources; and switching resources that are interconnected to form a hierarchical interconnect structure, and, additional interconnect resources that directly interconnect neighboring switching or base resources.

23 Claims, 18 Drawing Sheets

INTEGRATED CIRCUITS WITH HYBRID PLANER HIERARCHICAL ARCHITECTURE AND METHODS FOR INTERCONNECTING THEIR RESOURCES

FIELD OF INVENTION

This invention relates to configurable integrated circuits. Particularly, it relates to interconnect architectures for configurable integrated circuits.

BACKGROUND

Configurable integrated circuits differ from application specific integrated circuits (ASICs) in that a single underlying integrated circuit can be used to implement a variety of complex digital logic circuits by programming or configuring the underlying integrated circuit. As such, they have many applications and are less expensive to design and manufacture, except at extremely high volumes.

Field programmable gate arrays (FPGAs), mask programmable gate arrays (MPGAs), multi-processors for parallel computing, and system-on-chip integrated circuits (SOCs) are examples of configurable integrated circuits. Field programmable gate arrays are programmable in the field by the user while mask programmable gate arrays are programmable during manufacturing. A field or mask programmable gate array typically contains an array of modularized logic cells and signal routing resources where the routing resources can be configured or programmed to interconnect the logic cells to implement a variety of logic functions. In a multi-processor for parallel computing, either on a single chip or by linking multiple chips, the network of routing resources forms a routing architecture that routes data between the processors, depending on the logic design implemented and how the processors are scheduled. The interconnections between the processors, memories, and peripheral elements in a "system-on-chip" can be changed depending on the demands of the program that is running.

In general, configurable integrated circuits for devices such as field or mask programmable gate arrays comprise of logic or other functional cells that can be interconnected with each other with routing resources thus allowing for the transmission of signals within the integrated circuit. These logic or other functional cells shall be referred to herein generally as resources. The signal outputs, or drivers in said circuits can then be designed or programmed, via the selection of interconnect resources, to be interconnected to a set of one or more signal inputs or targets that are base resources to create a set of signal nets in order to implement a specific logic function.

Routing resources can be interconnect resources or switching resources. Interconnect resources can be wires, waveguides, or other channels designed to carry signals. Switching resources can be switches or multiplexers. A multiplexer is a switch that allows one to choose among a variety of detailed point to point signal routing paths, analogous to a track switch on a section of a railroad. Multiplexers are typically interconnected to base resources or other multiplexers by other interconnect resources such as wires and vias.

The basic structure of a traditional configurable integrated structure has a routing architecture that comprises of a two-dimensional array of logic cells connected with interconnecting resources in the form of a mesh. ["Flexibility of Interconnection Structures for Field Programmable Gate Arrays", J. Rose and S. Brown, *IEEE Journal of Solid-State Circuits*, vol. 26, no. 3, Mar. 1991. See also, Field Programmable Gate Arrays, Brown et al., page 4-5, Kluwer Academic Publishers, 1992.] Typically, the logic cells in field programmable gate arrays are arranged in a two-dimensional array or "mesh", comprising of a plurality of rows and columns of logic cells. One general example of such an integrated circuit is illustrated by the basic array structure in FIG. 1 where horizontal and vertical routing resources, typically wires and switches, occupy the area (112) between the rows and columns of the logic cells or base resources (111) and interconnect these cells. Input/output devices (IOs) are located at the periphery (113) of the array to propagate signals into and out of the field programmable gate array. Routing resources also directly interconnect each logic cell with the logic cells above and below and to either side of the logic cell. These routing resources enable the signal propagation between the logic cells.

Another variation of an integrated circuit with a mesh interconnect routing architecture is illustrated in FIG. 1b. In this example, input/output devices (113) are again located at the periphery of the array while the logic cells (111) are not only directly interconnected to their immediate logic cell neighbors horizontally and vertically but also diagonally by routing resources (112). This diagonal connectivity can be strictly logical in which case the actual physical routes would still comprise of horizontal and vertical rows, with a right angle "bend" at the physical chip-layout level.

Two critical factors can affect the cost and performance of an integrated circuit. The first is the speed at which a signal can propagate through that circuit. The second is the total amount of physical space needed to implement a particular logic function. One disadvantage of mesh arrays, such as those illustrated in FIG. 1a, is that the horizontal and vertical routing resources may occupy more than 95 percent of the chip area, i.e., the area of the integrated circuit. The large amount of chip area dedicated to the routing resources reduces the amount of chip area available for the base cells, thus reducing the complexity of digital logic circuits that can be implemented for a given device size. Since many digital logic circuits are modular, needing mainly local routing resources between cells, they do not need the general point-to-point interconnectivity, routing resources, and the physical space they occupy, are wasted.

Recently, integrated circuits with hierarchical interconnect routing architectures that reduce the amount of integrated chip space needed to implement logic functions while maintaining signal propagation speed have been proposed. [U.S. Pat. No. 6,940,308 proposed integrated circuits with a hierarchical interconnect routing architecture based upon Benes networks.] United States Patent Application No. 20030039262 proposed a multiplexer-based integrated circuit with a hierarchical interconnect routing architecture. In general, the hierarchical interconnect routing architectures of these integrated circuits can be mapped to a graph theoretic tree where interconnect resources such as wires and wave guides are mapped to the edges of the tree and switching resources and base resources are mapped to the nodes of the tree at the various levels of the tree hierarchy. Typically, the base resources such as logic cells are interconnected to the routing network at the lowest level of the tree. Switching resources at a particular level are interconnected to switching resources and base resources at the next lower or higher level by interconnect resources.

FIG. 2a illustrates the logical interconnections for a quadtree an example of an integrated circuit whose basic connectivity has a hierarchical interconnect routing architecture. This basic unit for the first two levels of the quadtree will also be referred to herein as a two level subtree. For this two level subtree, the interconnect resources (213) interconnect four base resources (211) at the first level to the switching resources (212) at the second level. For an integrated circuit with a quadtree structure having more than two levels, switching resources at the next higher are not shown in this Figure.

FIG. 2b illustrates a possible physical layout of this two level subtree. The four base resources (211) are interconnected to the next level of the hierarchy by routing resources (214) that include switching resources and interconnect resources. Each switching resource at a level is interconnected directly by interconnect resources to other switching resources at the next higher and/or lower level.

FIG. 3a illustrates the logical interconnections for a quadtree containing the first three levels of a quadtree. The interconnect resources (213) of this three level subtree interconnect four two level subtrees as illustrated by FIG. 2a to switching resources (212) at the third level. As shown in FIG. 3b, this three level quadtree can also be represented as four second level subtrees (215) as indicated in FIG. 3a that are hierarchically interconnected by interconnect resources (213) with switching resources on the third level (212). In this case, the branching factor of the tree is the same at each level. That is, the tree is "self-similar." However, other kinds of branching schemes, such as a "K-ary" tree can be accommodated in the same kind of framework.

FIGS. 3c and 3d illustrate a physical layout of this three level quadtree where routing resources (214) interconnect four second level subtrees with switching resources at the third level. This three level quadtree can also be represented as four second level subtrees (215) as indicated in FIG. 3a that are hierarchically interconnected by routing resources (214) with the switching resource on the third level (212).

Continuing this pattern, FIG. 4a illustrates the logic interconnections for the first four levels of a quadtree. Again, the interconnect resources (213) interconnect four three level subtrees (216) to switching resources (212) at the fourth level. Each three level subtrees (216) have four two level quadtrees (215) that hierarchically interconnect switching resources at the second level to the base resources at the first level. As shown in FIG. 4b, this four level quadtree can also be represented as four three level subtrees (216).

Figures 4C, 4D:
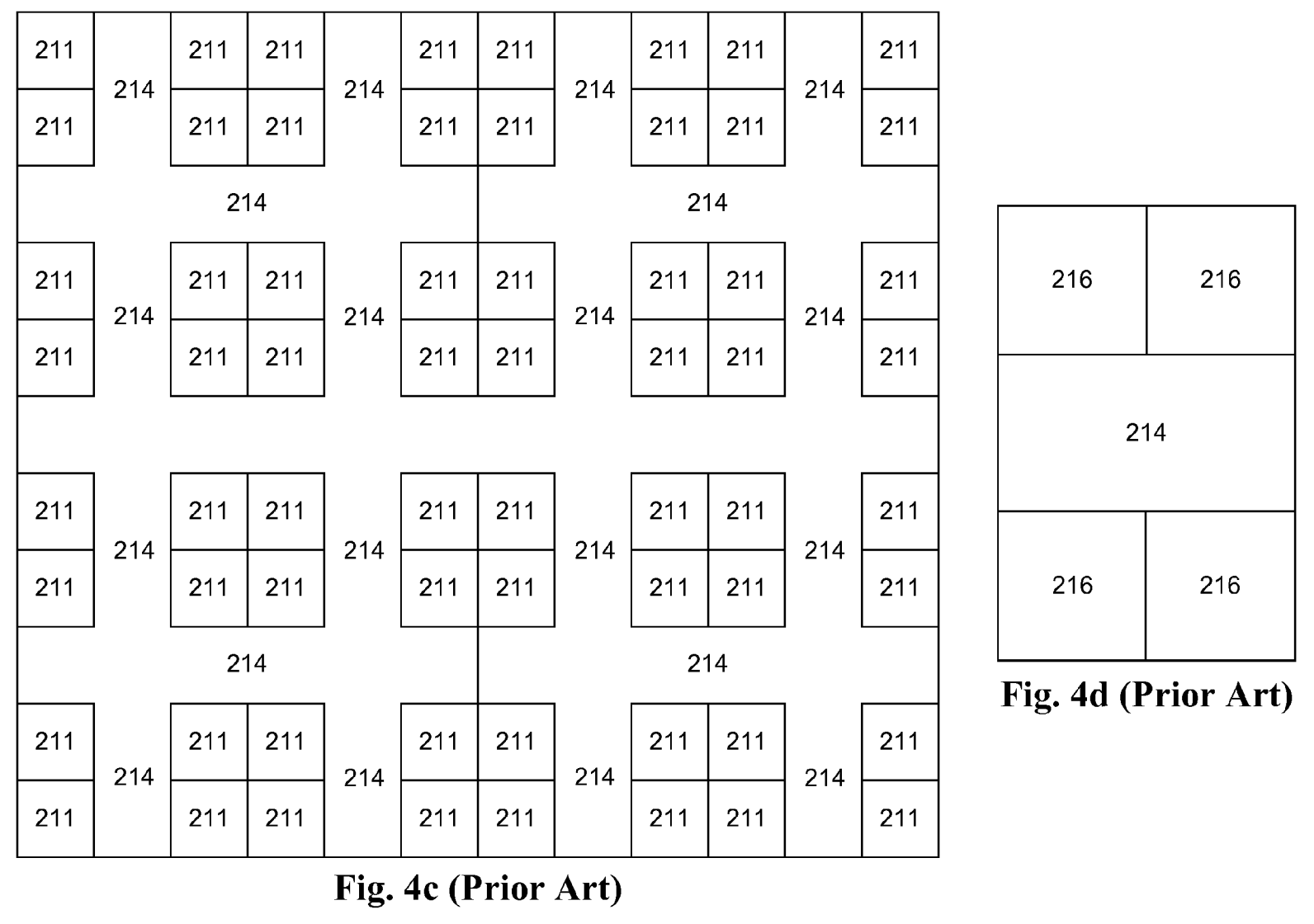

FIGS. 4c and 4d illustrate a possible physical layout of this four level quadtree where routing resources (214) interconnect four of three level subtrees as illustrated by FIG. 3a with switching resources at the fourth level. This four level quadtree can also be represented as four, third level subtrees (216) that are hierarchically interconnected by routing resources (214) with switching resources on the fourth level (212).

Following this formula, a quadtree of any number of levels can be built where, at the Nth level, interconnect resources interconnect the four (N−1)th subtree to switching resources at the Nth level and switching resources at the Nth level.

Using such an algorithm or a generalization thereof, an integrated circuit with a hierarchical interconnect routing architecture of any number of levels can be built where each level can contain a variety of subtrees and interconnect resources interconnect switching and base resources at a level with the subtrees at a lower level and switching and base resources at a higher level.

Integrated circuits with hierarchical interconnect routing architectures have many advantages. They allow for the use of subtrees as building blocks that can be assembled with a straightforward automated algorithm for arbitrary network sizes. Therefore, the design of this type of integrated circuit can be conducted with an automatic software generator that allows a user to specify the size of the integrated circuit.

Integrated circuits with hierarchical interconnect routing architecture are also highly scalable. As the number of base resources in an integrated circuit grows, the interconnection demands generally grow super-linearly. For integrated circuits with hierarchical interconnect routing architecture such as the quadtree described above, as the number of base resources grow, only the higher levels of the hierarchy need to expand while the lower levels remain the same. In contrast, in an integrated circuit with a mesh or planar interconnect routing architecture, every switching resource has to be expanded to accommodate the increased demands for routing resulting from an increase in the number of base resource.

However, there are also drawbacks. In an integrated circuit with hierarchical interconnect routing architecture, even though a base or switching resource may be physically placed close to another base or switching resource, they may be logically far apart if they belong to different subtrees at a level. For example, in FIG. 5, redrawn from the same hierarchical interconnect routing architecture in FIG. 3a, the base resources (517) and (518) from different subtrees may be physically next to each other but belong to a different subtrees, therefore, in order for a signal to travel from (517) to (518), the signal has to travel from the base resource in the first level, through the switching resources (504), (501), and (505) in second and third levels to reach base resource (518). Since signal speed is critical in some applications, an integrated circuit with a hierarchical interconnect routing architecture may be less desirable than one with a mesh interconnect routing architecture because of the potentially long distance that a signal may have to travel to reach its physical neighbor.

Due to the limitations of the prior art, it is therefore desirable to have methods for interconnecting resources in integrated circuits and integrated circuits with interconnect architectures that has the advantages of both mesh interconnect routing architectures and hierarchical interconnect routing architectures.

SUMMARY OF INVENTION

An object or this invention is to provide integrated circuits and methods for interconnecting resources to produce integrated circuits with improved performance.

Another object of this invention is to provide integrated circuits and methods for interconnecting resources to produce integrated circuits that have the advantages of integrated circuits with hierarchical interconnect routing architecture and integrated circuits with mesh interconnect routing architecture.

The present invention relates to methods for interconnecting base, switching and interconnect resources for configurable integrated circuits that include the following steps: interconnecting base and switching resources by interconnect resources to form a hierarchical interconnect structure; physically placing the hierarchically interconnect structure in a two dimensional format; and directly interconnecting selected neighboring base and switching resources. The integrated circuits generated include base resources, interconnect resources; and switching resources that are interconnected to form a hierarchical interconnect structure, and, additional interconnect resources that directly interconnect neighboring switching or base resources.

An advantage of this invention is that integrated circuits of this invention and integrated circuits with resources interconnected using methods of this invention have improved performance.

Another advantage of this invention is that integrated circuits of this invention and integrated circuits with resources interconnected with methods of this invention have the advantages of both integrated circuits with hierarchical interconnect routing architecture and integrated circuits with mesh interconnect routing architecture.

DESCRIPTION OF DRAWINGS

The foregoing and other objects, aspects and advantages of the invention will be better understood from the following detailed description of preferred embodiments of this invention when taken in conjunction with the accompanying drawings in which:

FIGS. 4c and 4d are illustrations of physical layouts of a configurable integrated circuit with a hierarchical interconnect routing architecture.

DETAILED DESCRIPTION OF THE PREFERRED EMBODIMENTS

Definitions and Description of Terms

Figure 1A:
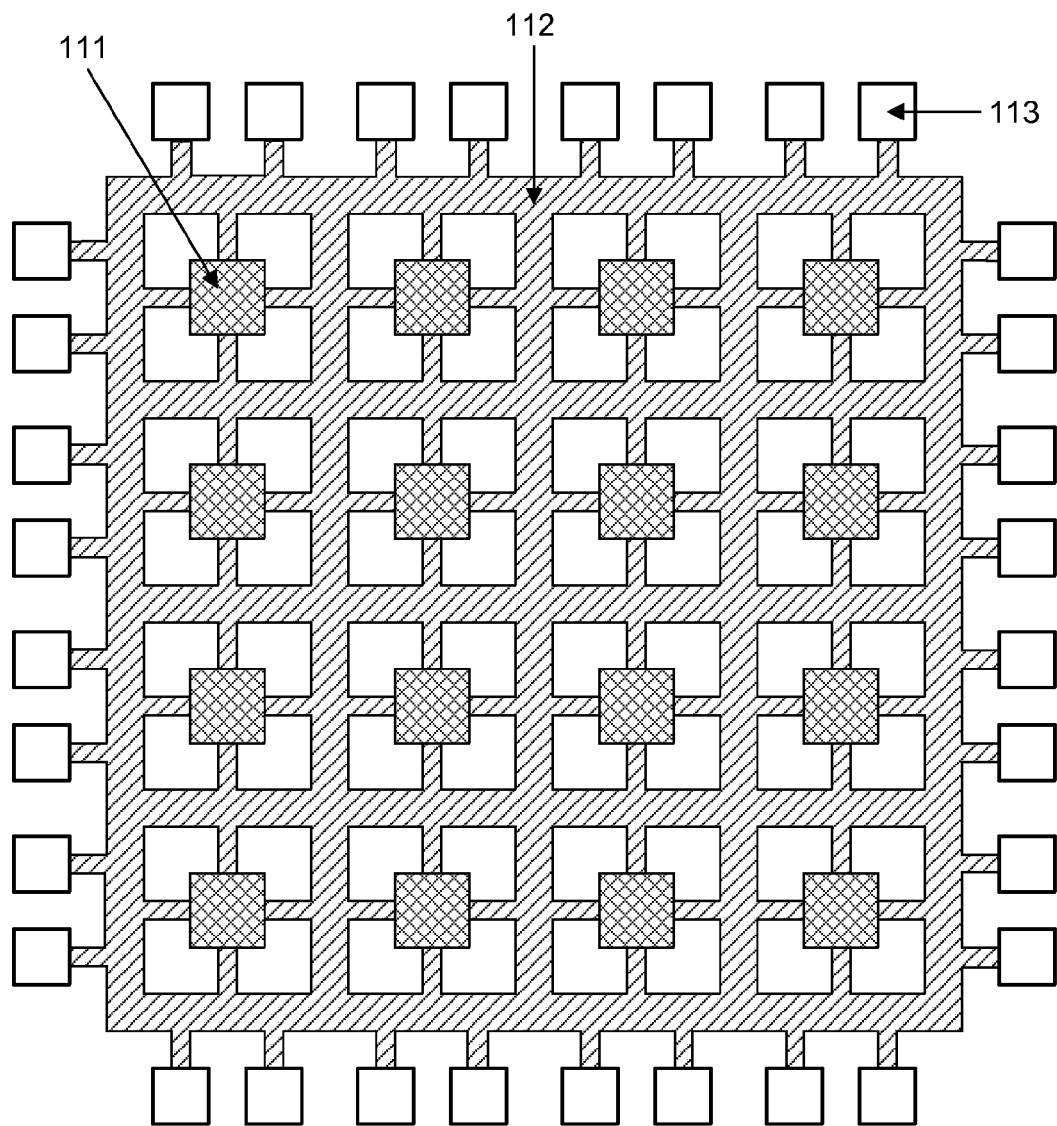
FIG. 1a is an illustration of a configurable integrated circuit with a mesh interconnect routing architecture.
Figure 1B:
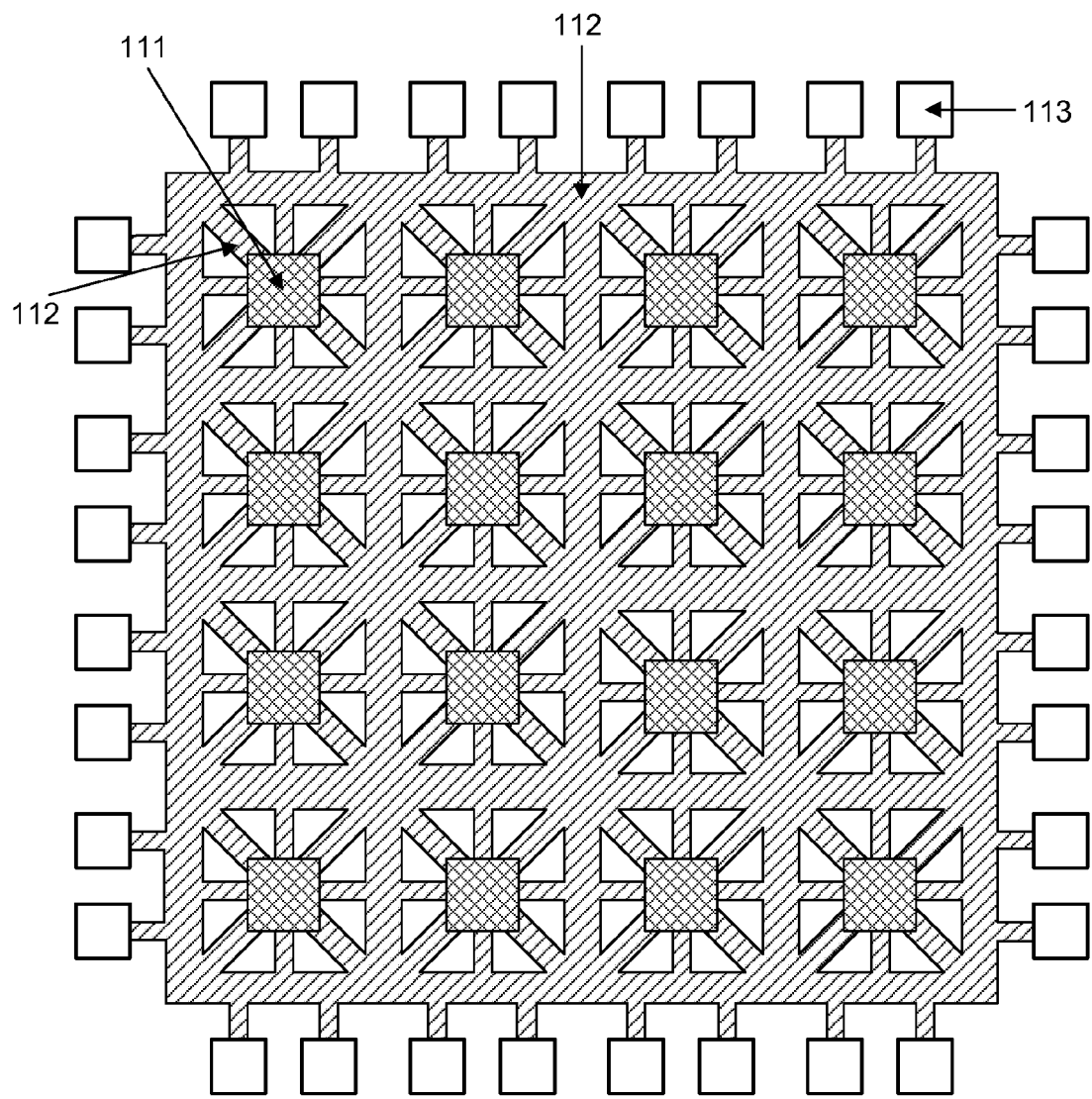
FIG. 1b is an illustration of another configurable integrated circuit with a mesh interconnect routing architecture.
Figure 2A:
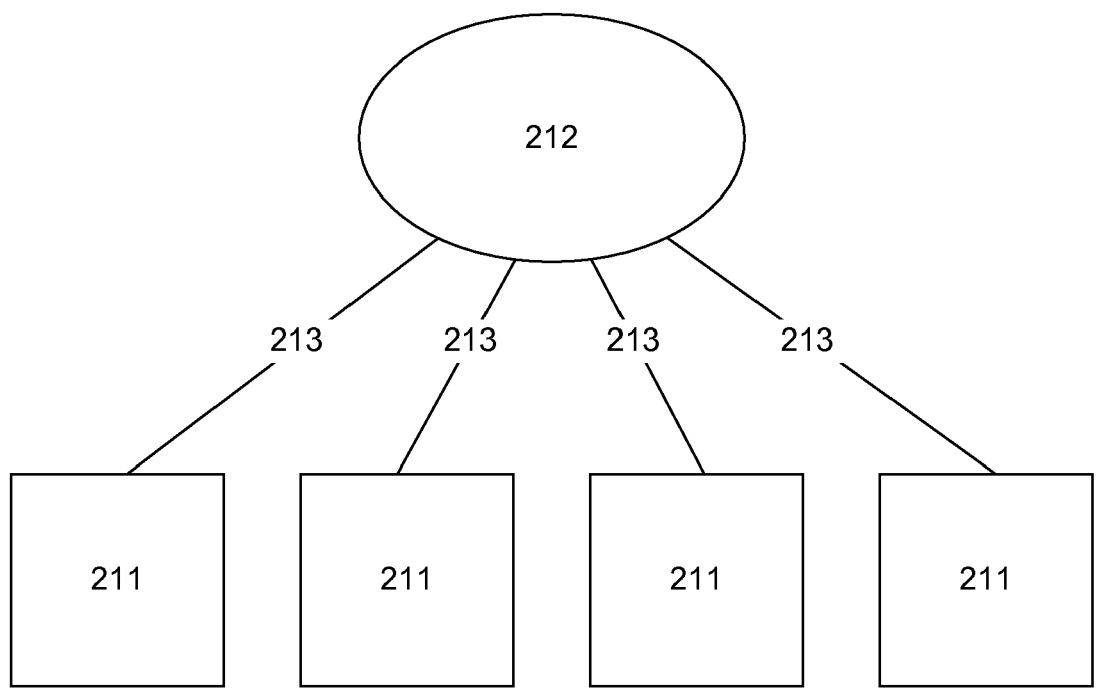
FIG. 2a is an illustration of a configurable integrated circuit with a hierarchical interconnect routing architecture.
Figure 2B:
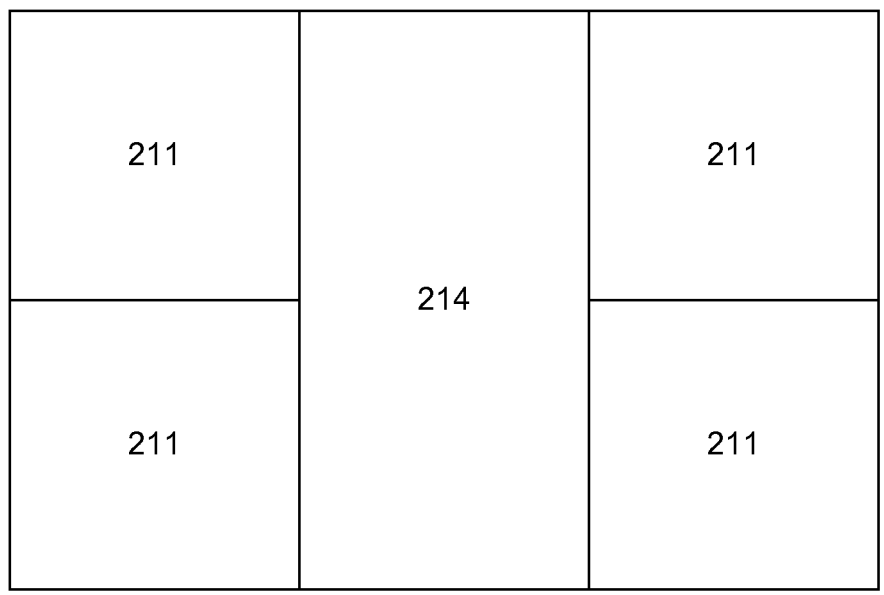
FIG. 2b is an illustration of a physical layout of a configurable integrated circuit with a hierarchical interconnect routing architecture.
Figure 3A:
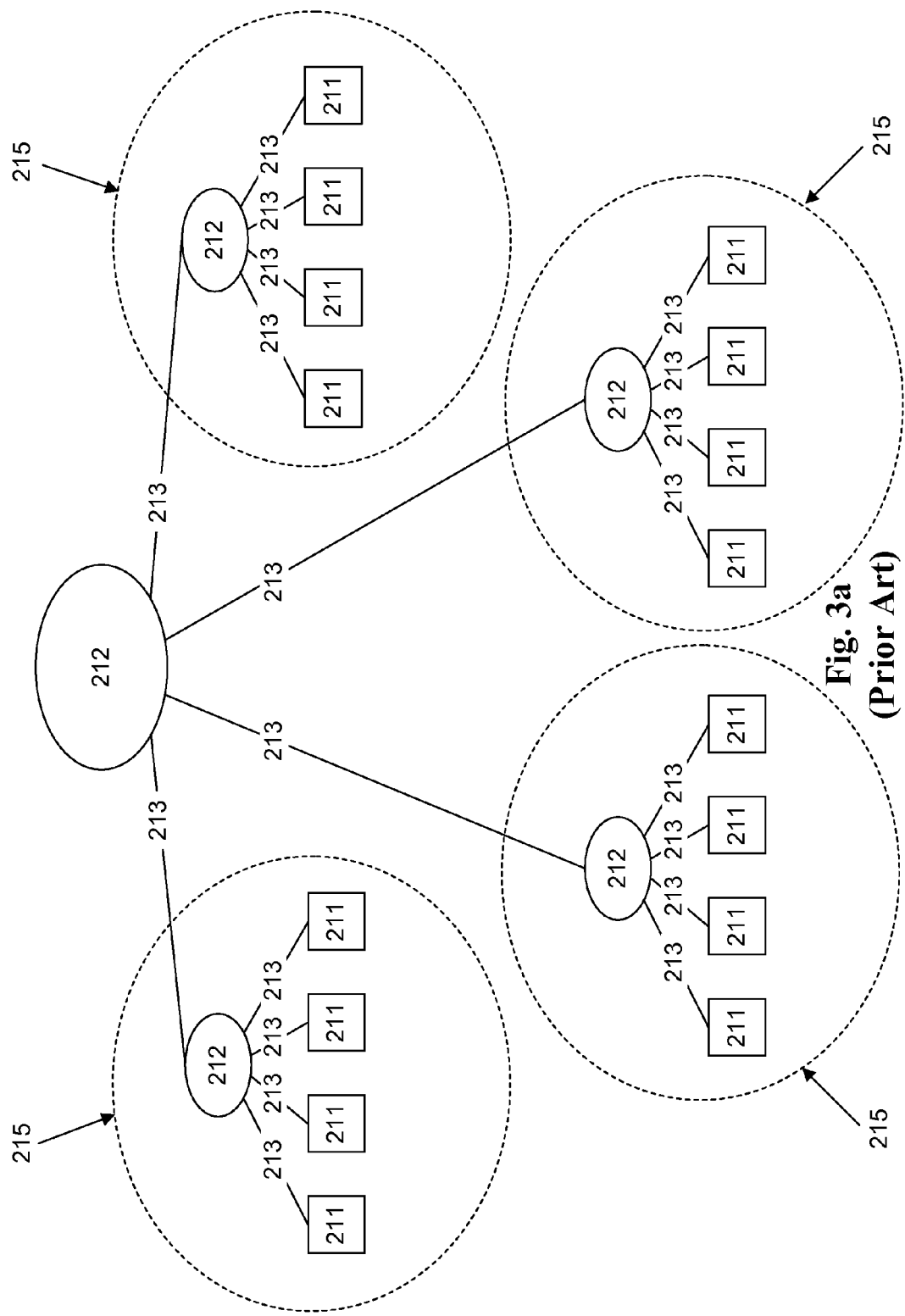
FIGS. 3a and 3b are illustrations of a configurable integrated circuit with a hierarchical interconnect routing architecture.
Figure 3B:
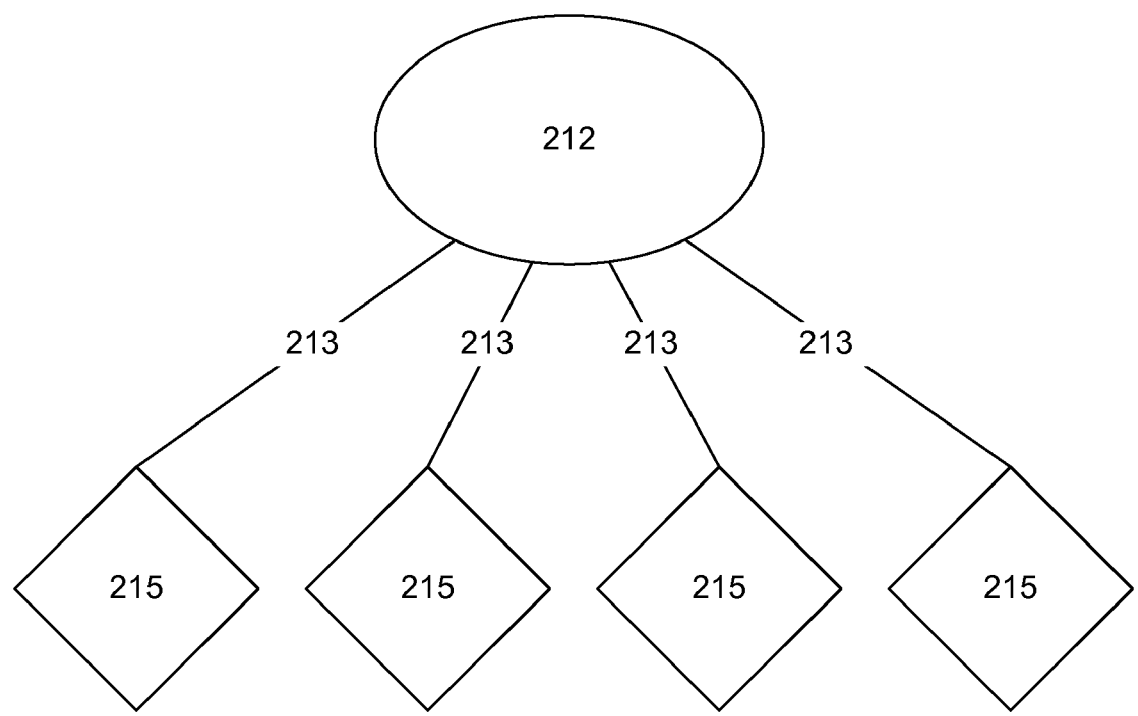
Figure 3C:
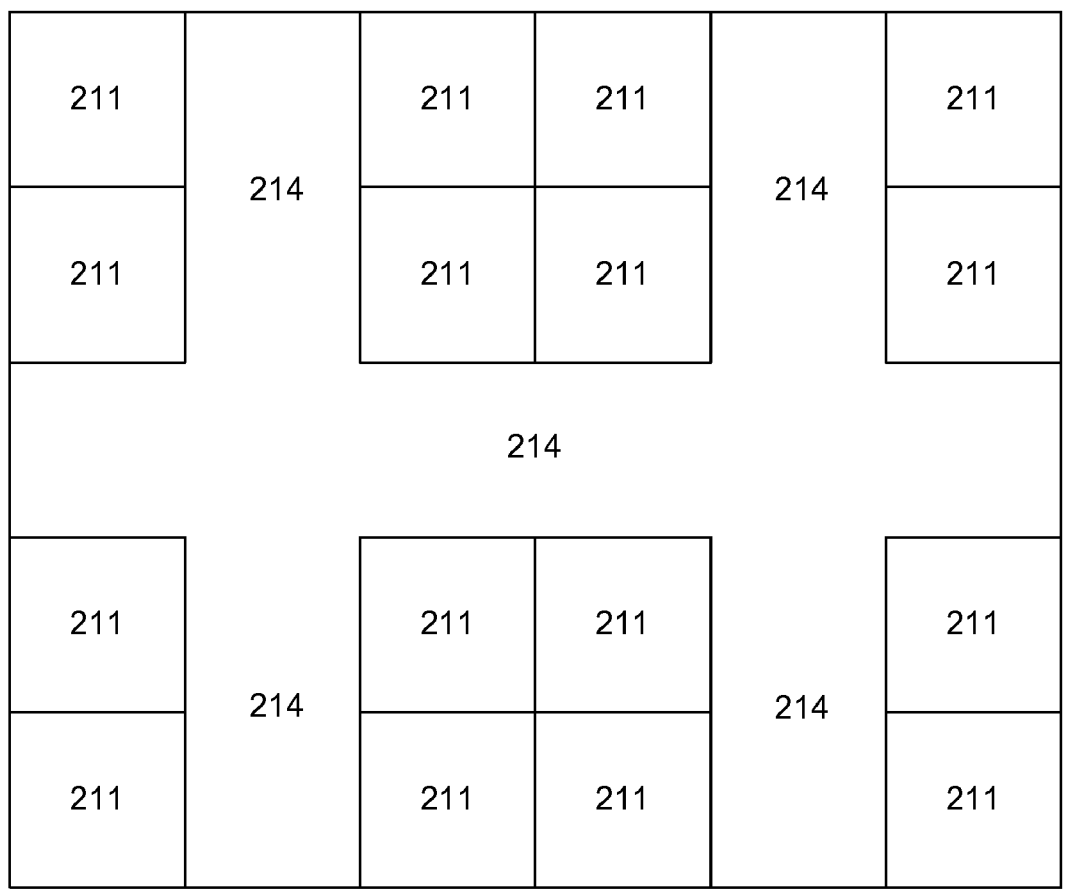
FIGS. 3c and 3d are illustrations of physical layouts of a configurable integrated circuit with a hierarchical interconnect routing architecture.
Figure 3D:
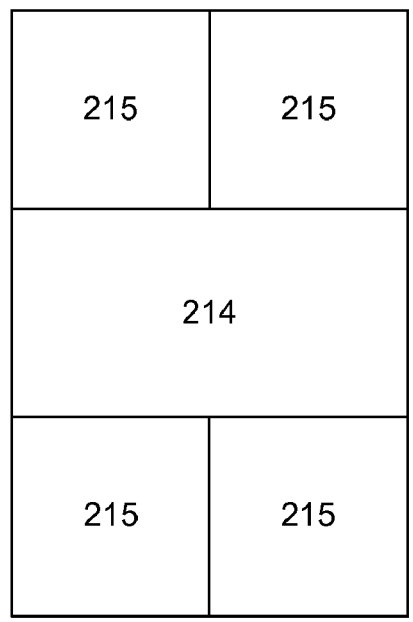
Figure 4A:
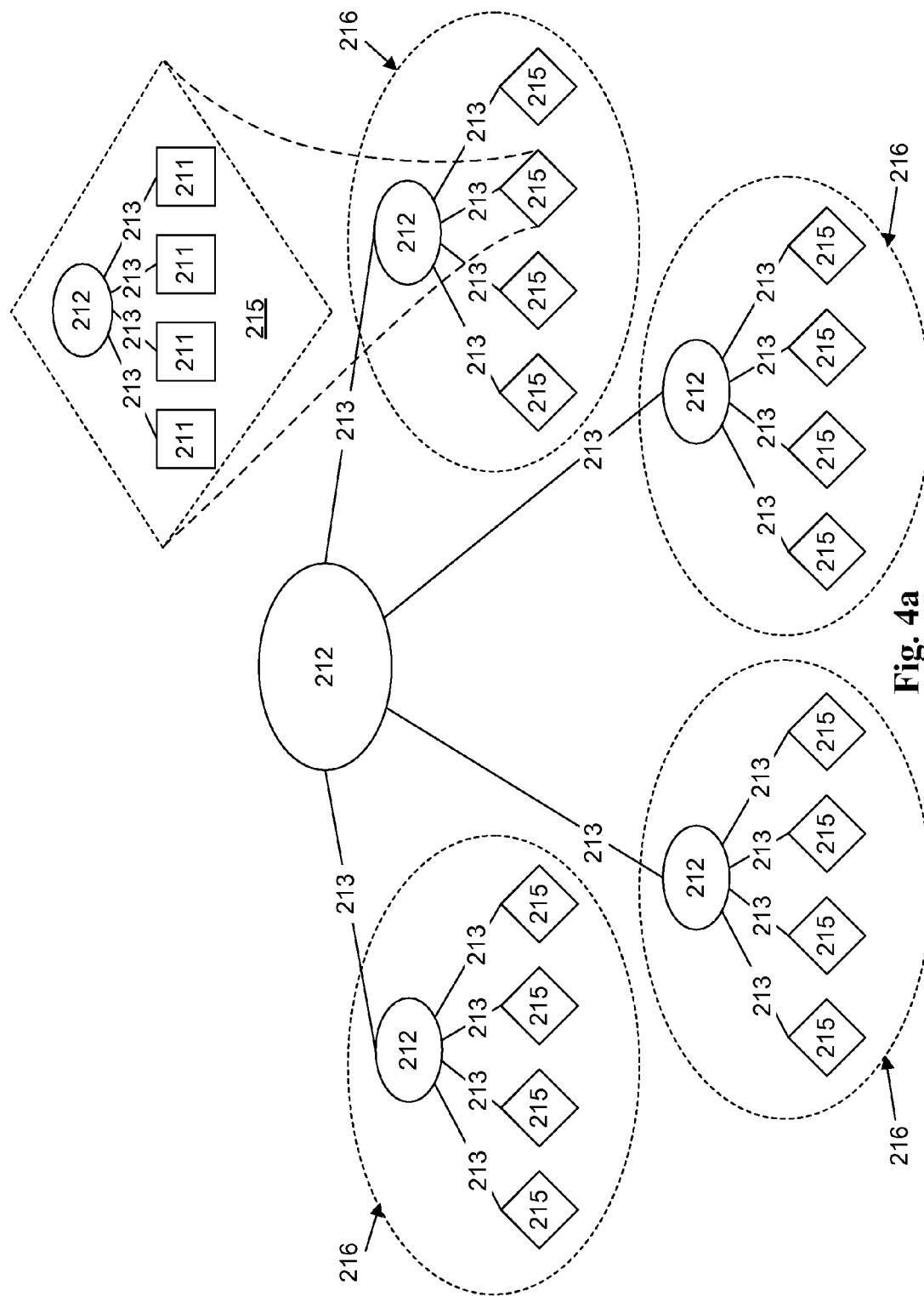
FIGS. 4a and 4b are illustrations of a configurable integrated circuit with a hierarchical interconnect routing architecture.
Figure 4B:
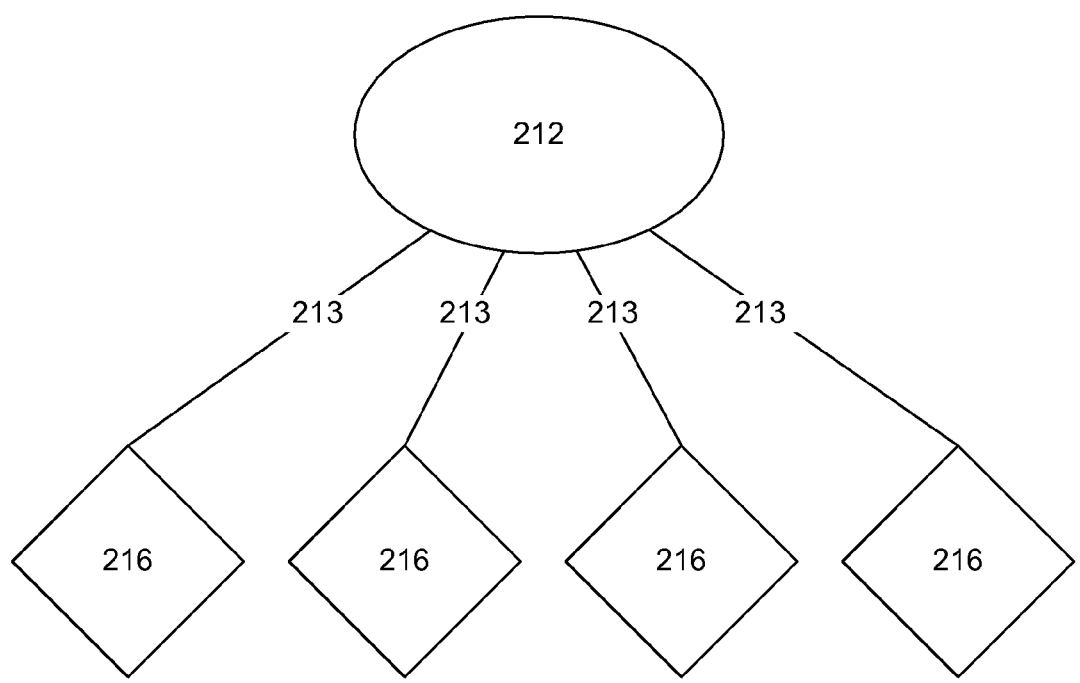
Figure 5:
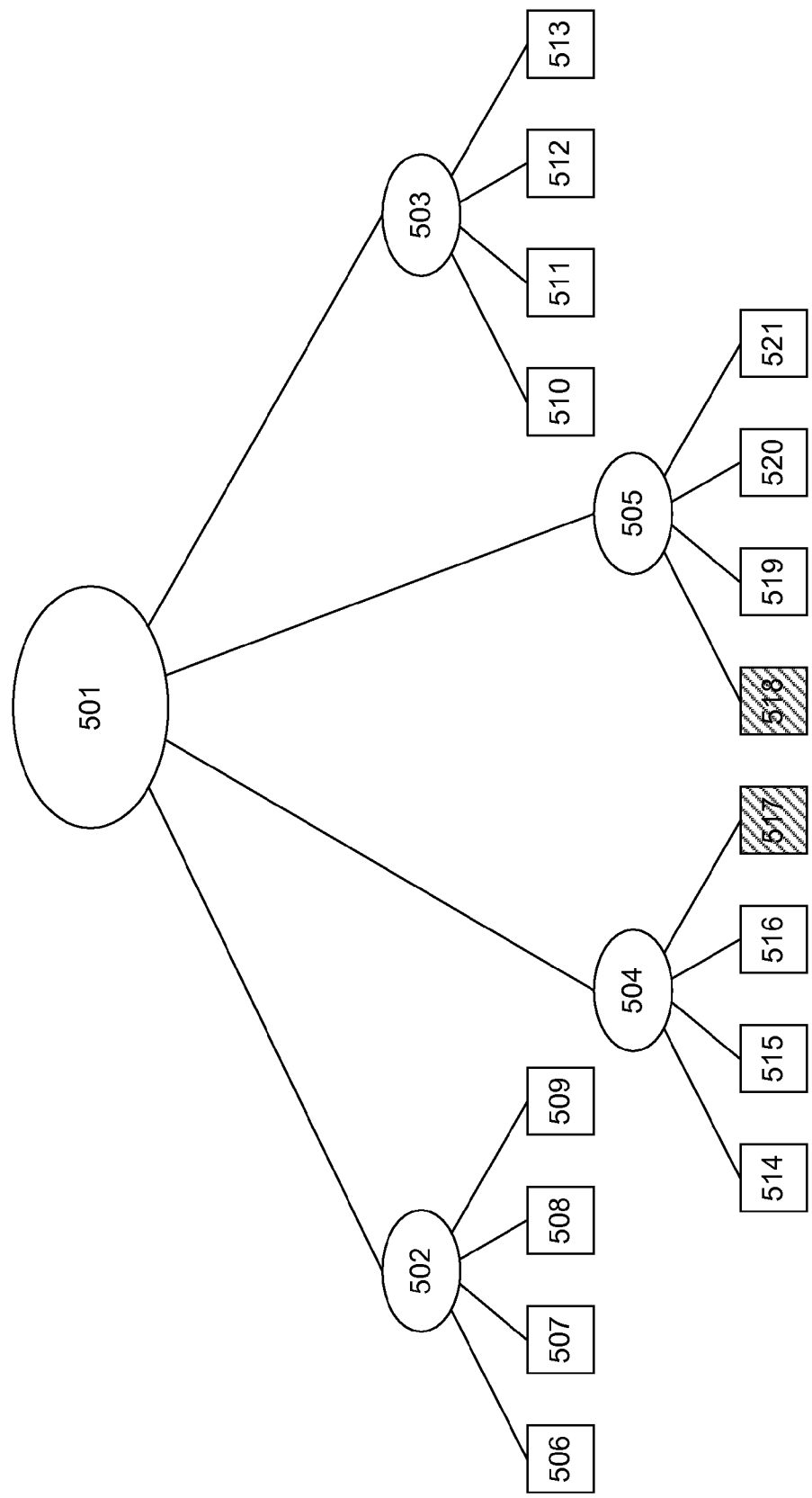
FIG. 5 is an illustration of a configurable integrated circuit with a hierarchical interconnect routing architecture.

Base Resource. A base resource in a configurable integrated circuit is a logic or other functional cell that can be interconnected to other base resources in a general way. Examples of base resources include memory cells, function cells, logic cells, inputs and outputs, and storage cells.

Interconnect Resource. An interconnect resource is used to interconnect base resources and switching resources. Examples of interconnect resources include (specifically) wires and (generally) wave guides.

Switching Resource. A switching resource is used for selecting and routing the base resources. Examples of switching resources include multiplexers, switches, and pass transistors.

Node resource. A base resource or a switching resource that is part of a hierarchical interconnect structure shall also be referred to as node resource.

Resource. Resource of a configurable integrated circuit may include base resources, switching resources, and interconnect resources.

Routing Resource. Routing resources used for routing an integrated circuit includes switching resources and interconnect resources.

Significant number or fraction. Significant number or fraction of a resource shall mean more than 10% of said resource in said integrated circuit. For example, if an integrated circuit includes 1000 switching resource, then a significant number or fraction of switching resource shall mean more than 100 switching resource.

Hierarchical Interconnect Structure (HIS). In a HIS, the switching resources and base resources can be mapped to the nodes of a graph theoretic tree, also referred to herein as a tree, while the interconnect resources can be mapped to the edges of the tree. In describing the embodiments of this invention and methods of the invention herein, switching and base resources that are part of a hierarchical interconnect structure can also be interconnected to other interconnects that are not part of the hierarchical interconnect structure. Base resources and switching resources that are part of a HIS are said to be interconnected in a hierarchical manner.

Root node. A node of a tree that is selected as the reference node. In a typical drawing of a tree, this root node is typically placed at the top of the tree.

Level. The level of a node resource is a measure of the lowest number of edges from said node to the root node. The root node is selected to be at the highest level of the tree. Typically, base resources are mapped to the lowest level of a tree.

Subtree. A subtree is a hierarchical interconnect sub-structure within a hierarchical interconnect structure. For example, a node in a HIS together with the edges and nodes at the levels lower than said the node and leading to said node is also a hierarchical interconnect structure. Any HIS can also be characterized as one or more non-intersecting subtrees that are hierarchically interconnected where non-intersecting subtrees are subtrees that do not share any edges or nodes. Since a subtree is also a HIS, each subtree can also have its own root node.

Figure 6A:
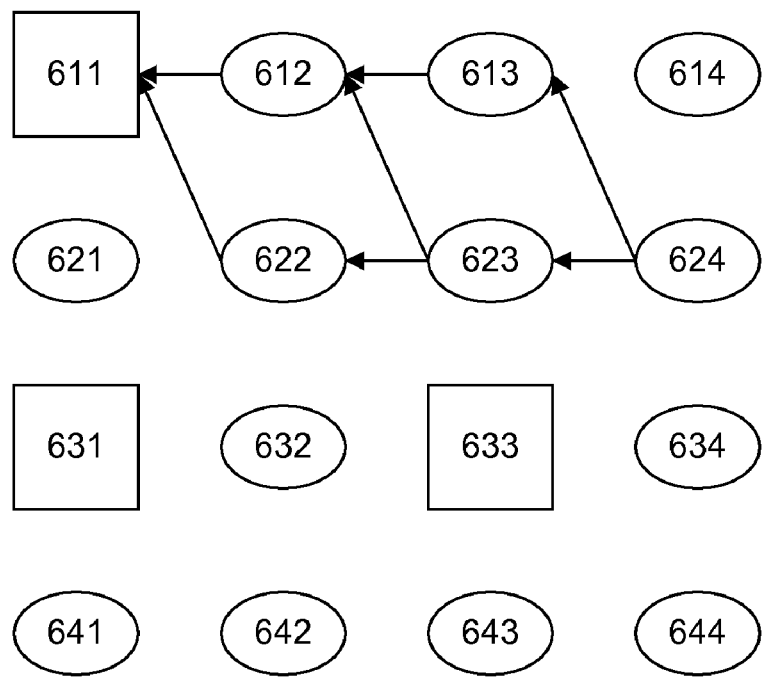
FIG. 6a is an illustration of neighbors in an example of a physical layout of an integrated circuit.

N-hop neighbor. An N-hop neighbor of a particular node resource is a node resource that is N nodes distant from that particular node resource with respect to the physical layout. A 1-hop neighbor of a node resource is a node resource that is physically adjacent to that node resource, i.e. a nearest neighbor. In FIG. 6a, where switching resources are represented by ellipses and base resources are represented by squares, the switching resource (614) is a 3-hop neighbor of base resource (611) in the horizontal dimension or direction while base resource (631) is a 2-hop neighbor of base resource (611) in the vertical dimension or direction. Similarly, base resource (633) is a 2-hop neighbor in the diagonal direction of base resource (611) and switching resource (614) is a 2-hop neighbor of switching resource (632), in a different diagonal direction. Switching resource (624) is a 3-hop neighbor of (611) by way of 2 horizontal-hops and one diagonal-hop along any of the 3 diagonal hop paths shown. A N-hop neighbor is also generally referred to herein as a neighbor.

Neighboring Resources. Two node resources are neighboring resources if they are N-hop neighbors.

Nearest Neighboring Resources. Two resources are nearest neighboring resources if they are 1-hop neighbors.

Directly Interconnected Subtrees. A subtree of a HIS is directly connected to another subtree by directly interconnecting the root node of the two subtrees.

Figure 6B:
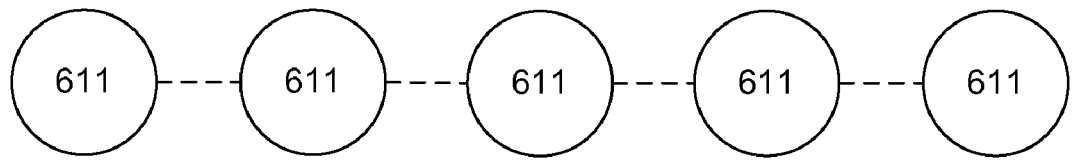
FIG. 6b is an illustration of node resources that are interconnected in a linear manner.

Interconnect in a linear manner or "linear interconnect". Interconnect in a linear manner or linear interconnect means the interconnecting of two or more neighboring node resources directly and linearly in one dimension, either horizontally, vertically, or diagonally. FIG. 6b is an illustration of node resources (611) that are interconnected linearly in the direction or dimension as indicated by the dotted lines.

Figure 6C:
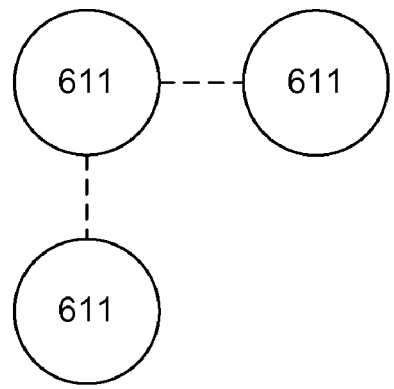
FIGS. 6c, 6d, and 6e are illustrations of node resources that are interconnected in a planar manner.
Figure 6D:
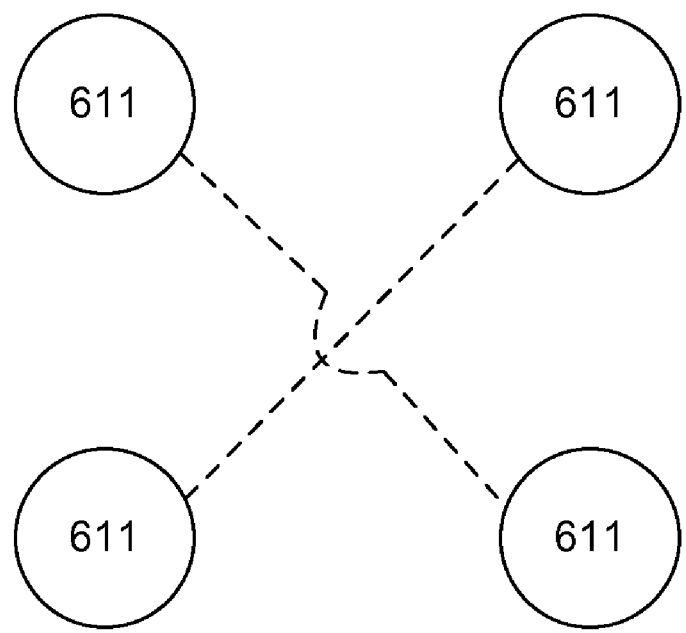
Figure 6E:
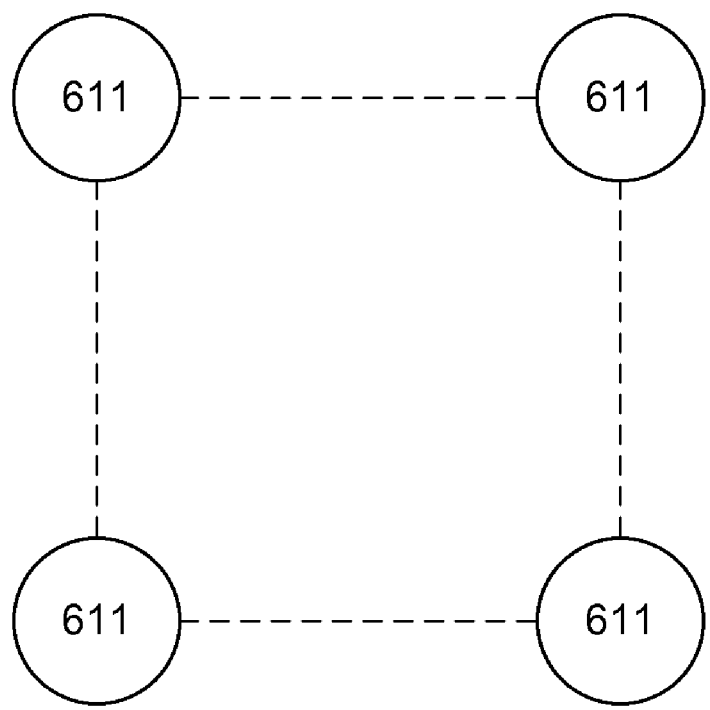

Interconnect in a planar manner or "planar interconnect". Interconnect in a planar manner or planar interconnect means directly interconnecting three or more node resources with other node resources in two or more dimensions or directions. In FIGS. 6c, d, and e illustrates some ways that node resources (611) can be interconnected in a planar manner as indicated by the dotted lines. Node resources from both the same and from different hierarchical levels can be directly interconnected in a planar manner.

Edge node resource. An edge node resource is a node resource that is near an edge of the integrated circuit. For example, a node resource is near an edge of an integrated circuit when the distance from that node resource to that edge is 10% or less than the center of the integrated circuit to that edge.

The presently preferred methods and embodiments provide for configurable integrated circuits with a hybrid architecture where the node resources within an HIS are additionally directly interconnected by additional routing resources in order to improve the performance characteristics of said integrated circuit.

The first step in generating a configurable integrated circuit with a hybrid architecture using the preferred methods of this invention is to form a HIS by interconnecting base resources with interconnect resources and switching resources such that the base resources and switching resources can be mapped to the nodes of a tree and the interconnect resources can be mapped to the edges of the tree. The resulting HIS is then placed in the two dimensional format in which the structure will be physically laid out in said integrated circuit. The routes of signals that can travel in said HIS from one base resource to another can then be examined and compared with routes formed by directly connecting physical neighbors of node resources to see if any direct interconnections between neighbors can provide a more advantageous route for one or more signals. The determination of what an advantageous route may depend on the critical specification for that configurable circuit, the available physical resources, the available device fabrication methodologies, and many other factors. One common objective is to reduce the time delay resulting from the interconnect resources that a signal has to traverse between any two nodes which need to be logically connected to implement the desired functionality. If there are such advantageous routes, the neighboring nodes providing these advantageous routes may be directly interconnected, preferably, by interconnect resources which are not part of the HIS, to form an integrated circuit with a hybrid architecture that is an embodiment of this invention.

Figure 7B:
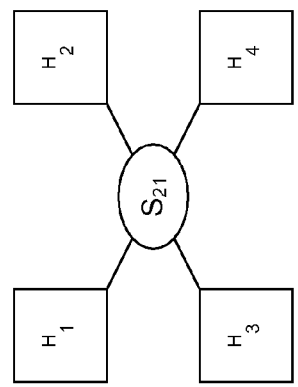
FIG. 7b is another illustration of a configurable integrated circuit with a hierarchical interconnect routing architecture.
Figure 7A:
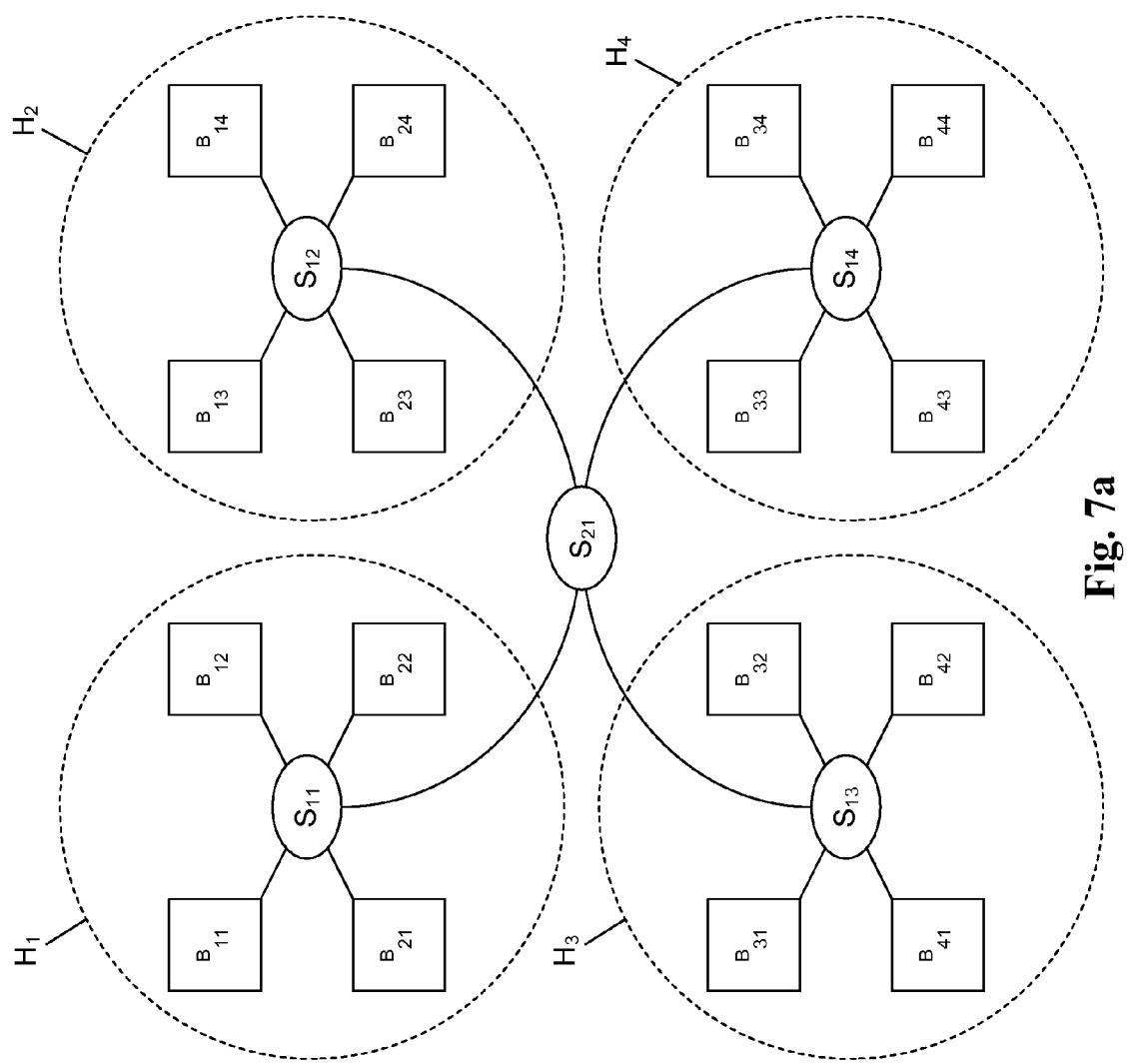
FIG. 7a is another illustration of a physical layout of a configurable integrated circuit with a hierarchical interconnect routing architecture.

FIG. 7a is the physical layout of a 3-level HIS, a quadtree, that can be used to form an integrated circuit with a hybrid architecture using the method of this invention by the addition of planar or linear interconnections. The base resources in this figure are denoted by $B_{ij}$, where i and j are integers between 1 and 4. The switching resources are denoted by Sij where i and j are integers and i+1 indicates the level of the switching resource. The solid lines indicate the interconnect resources that are part of the HIS. The base resources $B_{11}$, $B_{12}$, $B_{21}$, $B_{22}$ and switching resource $S_{11}$ form a basic subtree $H_1$. Similarly, the base resources $B_{31}$, $B_{32}$, $B_{41}$, $B_{42}$ and switching resource $S_{13}$, the base resources $B_{13}$, $B_{14}$, $B_{23}$, $B_{24}$ and switching resource $S_{12}$, and the base resources $B_{33}$, $B_{34}$, $B_{43}$, $B_{44}$ and switching resource $S_{14}$ each form basic subtrees, $H_3$, $H_2$, and $H_4$ respectively. This configuration can be illustrated as the subtrees that are hierarchically interconnected in FIG. 7b.

In the figures describing the preferred methods and embodiments of this invention and logical placement of quadtrees, i.e., in FIGS. 2a, 2b, 3a, 4a, 4b, 5, through 12, base resources are represented by squares, switching resources by ellipses, interconnects that are part of a HIS by solid lines, and planar interconnects by dotted lines connecting two node resources.

Once the basic HRS has been designed and placed such that its physical layout can be examined, the nodes in the physical layout can be examined to search for additional planar or linear interconnections that can create more advantageous routes than what the HIS can support.

Figure 8:
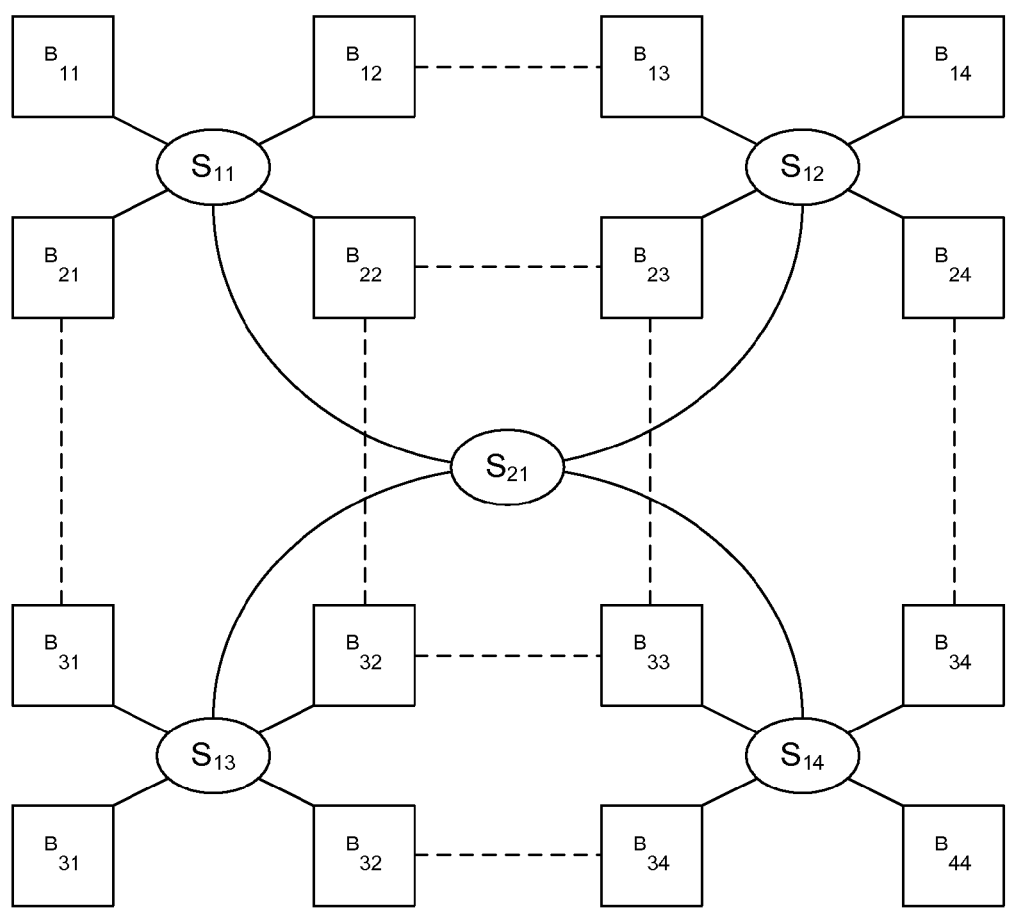
FIG. 8 is an illustration of a configurable integrated circuit with a hybrid architecture that is generated by the methods of this invention and that is an embodiment of this invention.

FIG. 8 shows a preferred embodiment where additional interconnections that are independent of this HIS, i.e., not part of the HIS, are indicated by dotted lines directly interconnect physical neighboring base resources belonging to different subtrees in a planar manner. For example, because of the direct interconnection between the 1-hop neighbor $B_{12}$ and $B_{13}$, signal from $B_{12}$ can travel directly to $B_{13}$. Without this direct interconnection, a signal from $B_{12}$ will have to travel to $S_{11}$, then to $S_{21}$ and $S_{12}$ and then down to $B_{13}$. The other similar direct or planar interconnections also similarly shorten the distance that a signal has to travel between two 1-hop neighbors.

Figure 9:
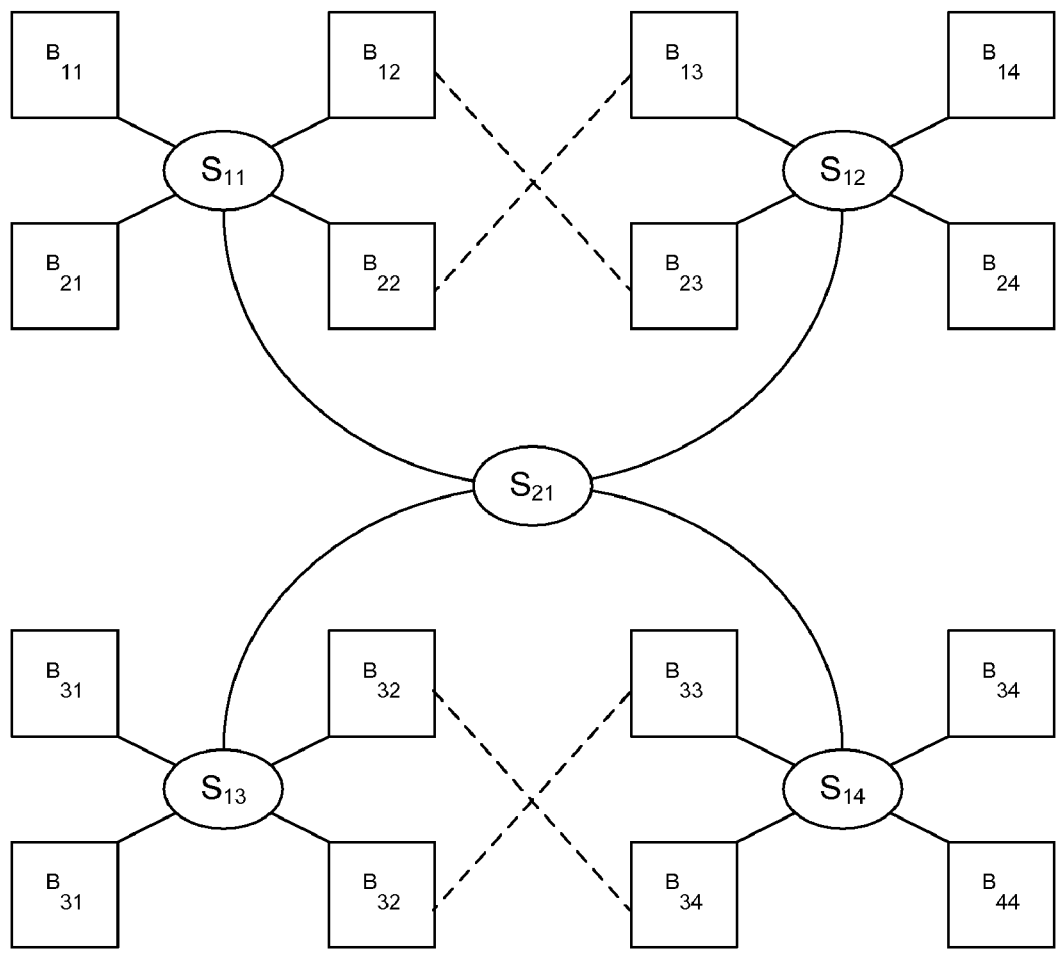
FIG. 9 is an illustration of another configurable integrated circuit with a hybrid architecture that is generated by the methods of this invention and that is an embodiment of this invention.

FIG. 9 is another embodiment having a direct interconnect indicated by dotted lines between neighboring node resources from different non-intersecting subtrees that are diagonal 1-hop neighbors. For example, $B_{12}$ is directly interconnected to $B_{23}$ and $B_{13}$ is directly interconnected to $B_{22}$. The advantages are similar. A signal from $B_{12}$ can travel directly through the additionally interconnected interconnect to $B_{23}$ without having to travel through $S_{11}$, $S_{21}$, $S_{12}$ to $B_{23}$.

Figure 10:
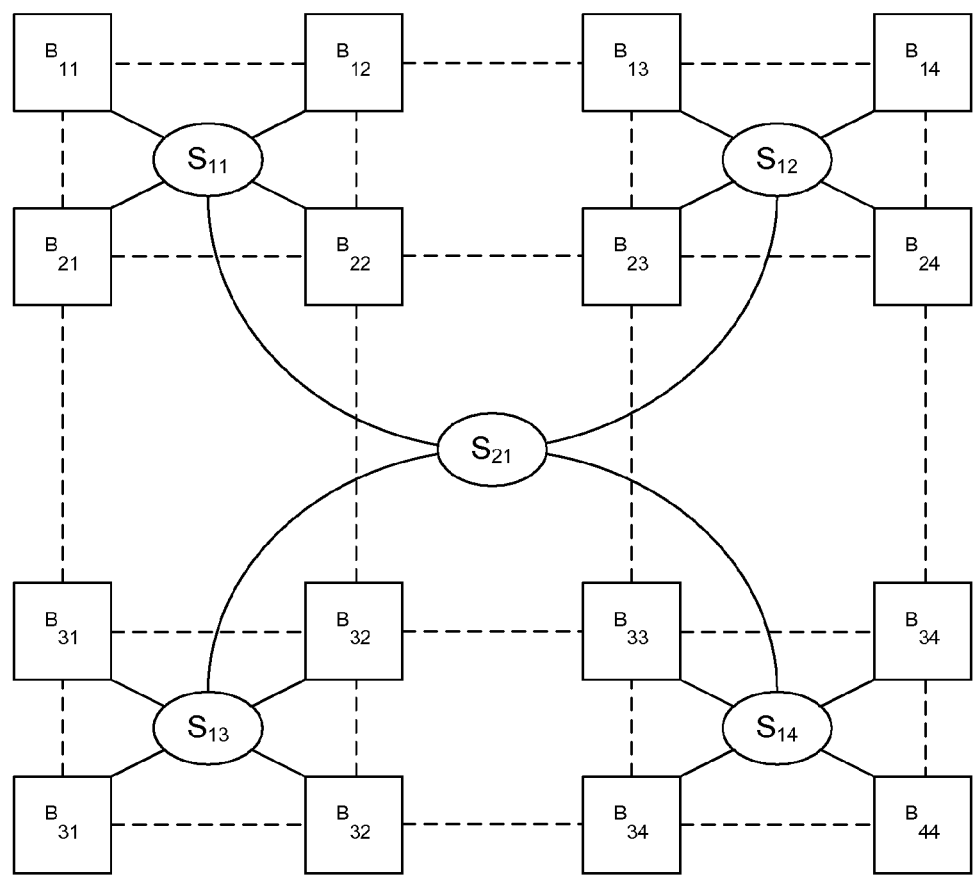
FIG. 10 is an illustration of another configurable integrated circuit with a hybrid architecture that is generated by the methods of this invention and that is an embodiment of this invention.

FIG. 10 is a third embodiment where all the base resources are directly interconnected in a planar manner with each other as well as being part of the HIS but now, additional planar routes between nodes in the same subtree are also added. Again, depending on the physical distance between two node resources, the planar interconnections allows shortcuts between node resources that are physically close to each other and bypass the lengthy paths that are necessary within the HIS. They may also provide smaller local delay improvements. For example, nodes $B_{11}$ and $B_{12}$ can now connect directly, avoiding the wire and switch delay needed for them to connect hierarchically via the next-level node $S_{11}$.

Figure 11:
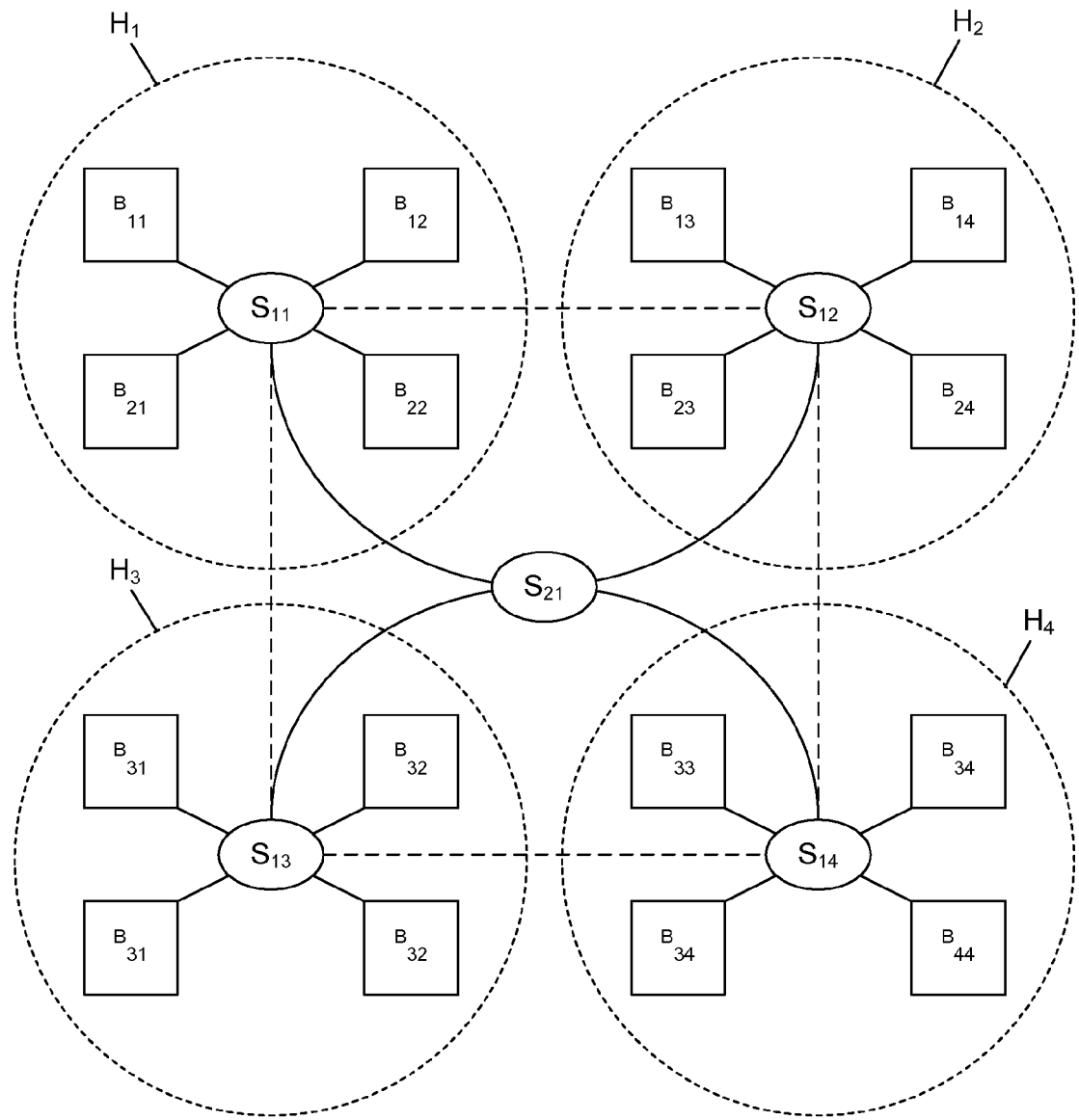
FIG. 11 is an illustration of another configurable integrated circuit with a hybrid architecture that is generated by the methods of this invention and that is an embodiment of this invention.

FIG. 11 is another preferred embodiment where the four sub-trees, H1, H2, H3, and H4 are interconnected in a planar manner at the second level of the HRS.

Figure 12:
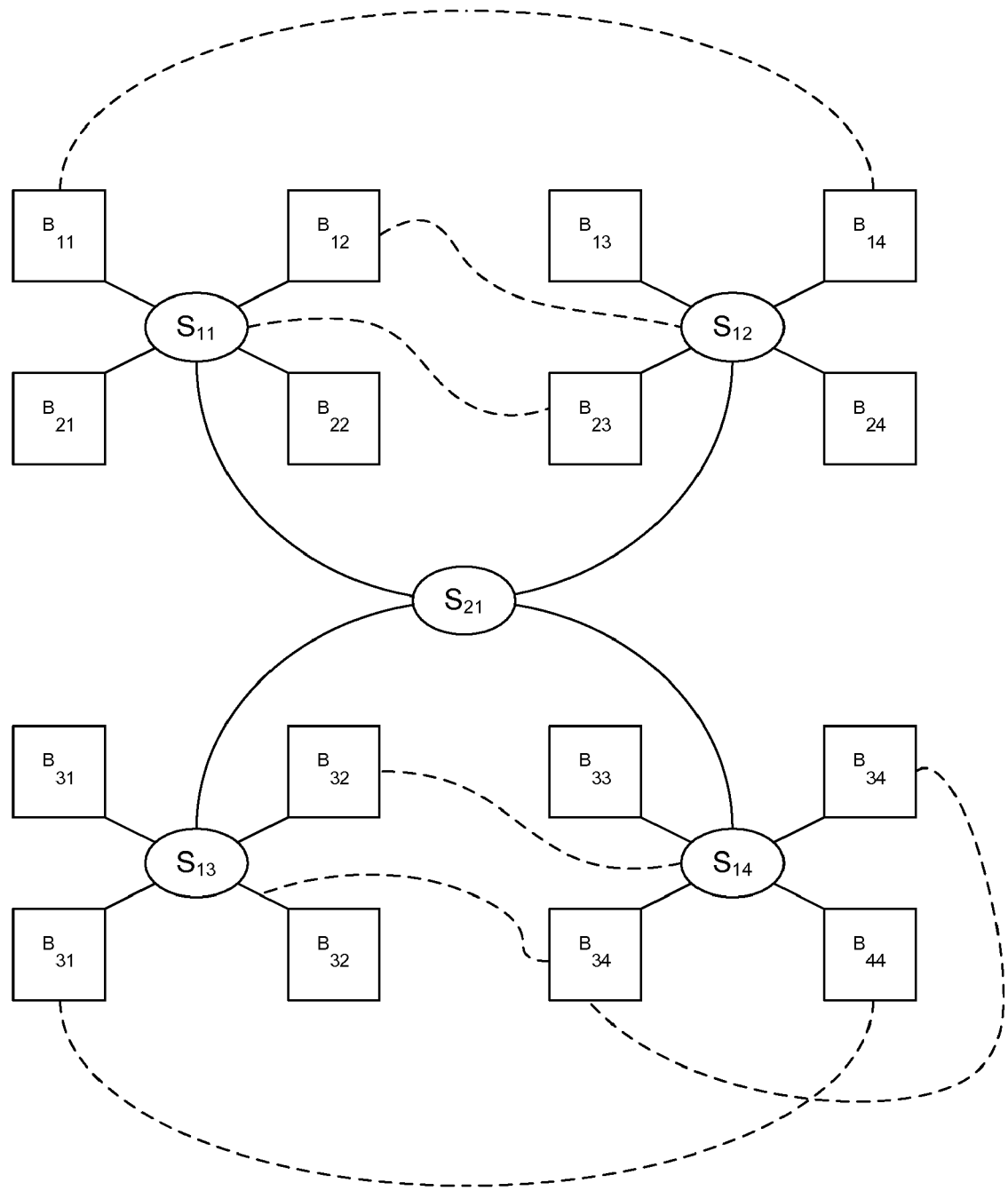
FIG. 12 is an illustration of another configurable integrated circuit with a hybrid architecture that is generated by the methods of this invention and that is an embodiment of this invention.

The above described methods are also applicable for generating hybrid integrated circuits where neighboring node resources from different levels of the hierarchy in the HIS are interconnected directly, either in a linear or planar manner. FIG. 12 is a preferred embodiment where the node resource $S_{11}$ at the second level is interconnected directly to the node resource $B_{23}$ at level one.

The above described methods also allow direct interconnection between resources that are multiple hops away from each other. For example, in the preferred embodiment in FIG. 12, the node resource $B_{11}$ is directly interconnected with its 3-hop neighbor $B_{14}$.

The methods of generating a configurable integrated circuit with a hybrid architecture and the resulting embodiments are described in the context of a three level HIS that is a quadtree. However directly interconnecting node resources with linear and planar resources in a HIS to create shortcuts is applicable to any HIS regardless of the size of the HIS and the internal structure of the HIS. Thus, these methods may be used to generate integrated circuits with a hybrid architecture where the underlying HIS can have any number of levels and each level can have sub-trees of any size, or even mixes of subtrees of different sizes.

In preferred embodiments, in order to improve the overall performance of the integrated circuit, the direct interconnecting of neighboring node resources in a planar or linear manner has to be repeated throughout the integrated circuits such that a significant number of node resources, i.e., over 10% of the node resources of an integrated circuits are so interconnected.

The preferred methods generate preferred embodiments that improve the performance of the integrated circuits as the number of base resources and thus number of hierarchical levels are increased in the underlying HIS. In these complex configurable integrated circuits, the distance that a signal has to travel from a physically neighboring node resources in one subtree to another node resource in another non-intersecting subtree may increase super-linearly with the number of hierarchy levels in the HIS. Systematic strategic placement of linear or planar interconnects can significantly reduce the distance a signal have to travel between the node resources.

Other preferred embodiments that can be generated by the preferred methods of this invention are integrated circuits with toroidal interconnects where dedicated high-speed routing resources is provided to interconnect node resources near or at a physical edge of the integrated circuit, edge node resource, in a "wraparound" fashion with edge node resources near or at another physical edge. The physical edges in an integrated circuit with toroidal interconnects may be on diametrically opposite sides of the integrated circuit, one of the other 2 sides, or any combination of the three. Although the routing resources for these toroidal interconnects may be physically long, they may provide for a lower-delay path between the base resources in the regions of the chip rather than the hierarchical or other planar interconnects in the integrated circuit. They may also provide other performance benefits for logically related cells that are placed on opposite sides of the physical layout. Such placements may occur as a result of poor placement options for the logic, either as a result of I/O-related placement constraints or the typical suboptimality in complex NP complete placement problems of this type. If toriodial interconnects that improve the overall quality of the global placement solution for an integrated circuit can be implemented using these preferred methods, the placement algorithm may be modified to deliberately place logic cells that normally should be physically close at opposite sides of the array so as to take advantage of the toroidal interconnections.

While the present invention has been described with reference to certain preferred embodiments, it is to be understood that the present invention is not limited to such specific embodiments. Rather, it is the inventor's contention that the invention be understood and construed in its broadest meaning as reflected by the following claims. Thus, these claims are to be understood as incorporating not only the preferred embodiments described herein but all those other and further alterations and modifications as would be apparent to those of ordinary skill in the art.

We claim:

1. A method for interconnecting resources in a configurable integrated circuit having node resources and interconnect resources comprising the steps of:
   interconnecting said node resources in a hierarchical manner with a plurality of said interconnect resources to form a hierarchical interconnect structure, wherein said node resources comprise a plurality of base resources and a plurality of switching resources;
   placing said node resources and said interconnect resources in accordance with said hierarchical interconnect structure; and
   directly interconnecting selected base resources.

2. The method of claim 1 wherein said integrated circuit also having routing resources, and, in said directly interconnecting step, neighboring node resources are directly interconnected by routing resources independent of the hierarchical interconnect structure.

3. The method of claim 1 wherein in said directly interconnecting step, selected node resources are directly interconnected in a planar manner.

4. The method of claim 1 wherein said hierarchical interconnect structure having a plurality of subtrees, and
   in said directly interconnecting step, selected subtrees are directly interconnected.

5. The method of claim 1 wherein said hierarchical interconnect structure having a plurality of subtrees, and
   in said directly interconnecting step, selected subtrees are directly interconnected in a planar manner.

6. The method of claim 1 wherein in said directly interconnecting step, a significant number of said node resources are selected.

7. The method of claim 1 wherein in said directly interconnecting step, selected nearest neighboring node resources are interconnected.

8. The method of claim 1 wherein said integrated circuit having edge node resources, and in said directly interconnecting step, selected edge node resources are interconnected.

9. The method of claim 2 wherein in said directly interconnecting step, selected node resources are directly interconnected in a planar manner.

10. The method of claim 2 wherein in said directly interconnecting step, a significant number of said node resources are selected.

11. The method of claim 3 wherein in said directly interconnecting step, a significant number of said node resources are selected.

12. The method of claim 7 wherein in said directly interconnecting step, a significant number of said node resources are selected.

13. A configurable integrated circuit comprising:
    a plurality of base resources;

a plurality of interconnect resources; and a plurality of switching resources wherein one or more of said base resources and one or more of said switching resources are interconnected in a hierarchical manner with one or more of said interconnect resources to form a hierarchical interconnect structure;

said base resources, said interconnect resources, and said switching resources are placed in accordance with said hierarchical interconnect structure; and certain selected base resources in said hierarchical interconnect structure are additionally directly interconnected.

14. The integrated circuit of claim 13 wherein said selected base resources in said hierarchical interconnect structure are additionally interconnected directly in a planar manner with switching resources or base resources.

15. The integrated circuit of claim 13 wherein said selected base resources are additionally directly interconnected with switching resources or base resources by interconnect resources that are independent of the hierarchical interconnect structure.

16. The integrated circuit of claim 13 wherein a significant number of said base resources or switching resources in said hierarchical interconnect structure are additionally interconnected directly with neighboring switching resources or base resources.

17. The integrated circuit of claim 13 wherein said selected base resources are additionally interconnected directly with their nearest neighboring switching resources or nearest neighboring base resources.

18. The integrated circuit of claim 13 wherein said integrated circuit having edge base resources or edge switching resources, and wherein selected edge base resources or edge switching resources are additionally interconnected directly with edge switching resources or edge base resources.

19. The integrated circuit of claim 14 wherein a significant number of said base resources or switching resources in said hierarchical interconnect structure are additionally interconnected directly with neighboring switching resources or base resources.

20. The integrated circuit of claim 17 wherein a significant number of said base resources or switching resources in said hierarchical interconnect structure are additionally interconnected directly with neighboring switching resources or base resources.

21. A configurable integrated circuit comprising:

a plurality of base resources;

a plurality of interconnect resources; and a plurality of switching resources wherein one or more of said base resources and one or more of said switching resources are interconnected in a hierarchical manner with one or more of said interconnect resources to form a hierarchical interconnect structure having subtrees;

said base resources, said interconnect resources, and said switching resources are placed in accordance with said hierarchical interconnect structure;

selected base resources in said hierarchical interconnect structure are directly interconnected; and selected subtrees are additionally directly interconnected.

22. The integrated circuit of claim 21 wherein selected subtrees are additionally directly interconnected in a planar manner.

23. The integrated circuit of claim 21 wherein a significant number of node resources in said hierarchical interconnect structure are directly connected.

* * * * *